(12) United States Patent
Kaviani

(10) Patent No.: US 6,480,023 B1
(45) Date of Patent: Nov. 12, 2002

(54) CONFIGURABLE LOGIC BLOCK FOR PLD

(75) Inventor: Alireza S. Kaviani, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/687,812

(22) Filed: Oct. 13, 2000

(51) Int. Cl.$^7$ ............................................. H03K 19/173
(52) U.S. Cl. ......................................... 326/38; 326/47
(58) Field of Search .............................. 326/37–39, 41, 326/47, 101

(56) References Cited

U.S. PATENT DOCUMENTS

| | | | |
|---|---|---|---|
| RE34,363 E | | 8/1993 | Freeman |
| 5,267,187 A | | 11/1993 | Hsieh et al. |
| 5,349,250 A | | 9/1994 | New |
| 5,357,153 A | | 10/1994 | Chiang et al. |
| 5,365,125 A | * | 11/1994 | Goetting et al. ............... 326/39 |
| 5,444,394 A | * | 8/1995 | Watson et al. ................. 326/45 |
| 5,668,771 A | | 9/1997 | Cliff et al. |
| 5,889,411 A | | 3/1999 | Chaudhary |
| 6,107,822 A | * | 8/2000 | Mendel et al. ................. 326/39 |
| 6,118,300 A | * | 9/2000 | Wittig et al. ................... 326/41 |

OTHER PUBLICATIONS

Rhyne, Fundamental of Digital Systems Design, N.J., 1973, pp. 70–71.*
Rhyne, Fundamental of Digital Systems Design, N.J., 1973, pp. 70–71.*
"The Programmable Logic Data Book 1996"; available from Xilinx, Inc., 2100 Logic Drive, San Jose, CA 95124; pp. 4–32 to 4–37.

* cited by examiner

Primary Examiner—Michael Tokar
Assistant Examiner—James H. Cho
(74) Attorney, Agent, or Firm—D. James Chung; Edel M. Young

(57) ABSTRACT

A method and apparatus for implementing fast sum-of-products logic in an FPGA is disclosed. The method includes literal-sharing decomposition of the sum-of-products logic to reduce the number of configurable logic block (CLB) slices required to implement wide fan-in logic functions on an FPGA. The decomposition is performed by combining product terms having similar literal patterns. The apparatus includes a CLB including a plurality of slices and a second-level logic (separate from the slices) circuit to combine the outputs of the slices. Typically, the second-level logic is an OR gate or its equivalent that implements the sum portion of the sum-of-products expression. Alternatively, a combining gate may be included within the slice to combine the output of the slice to output of another slice preceding the first slice. In this case the combing gates of each of the slices are connected in series to sum the result of the product operation of a given slice with the product operations from preceding slices. The slice may also include a dedicated function generator to increase the performance of each slice to implement wide functions, particularly sum-of-products functions. The dedicated function generator may be an AND gate and an OR gate with a multiplexer as a selector.

16 Claims, 11 Drawing Sheets

CONFIGURABLE LOGIC BLOCK FOR PLD

BACKGROUND

This invention relates to programmable integrated circuit devices. More specifically, the present invention relates to field programmable gate arrays (FPGAs).

An FPGA is a type of programmable logic device (PLD) that can be configured to perform various logic functions. An FPGA includes an array of configurable logic blocks (CLBs) connectable via programmable interconnect structures. For example, a first FPGA, invented by Freeman, is described in U.S. Pat. no. RE34,363. CLBs and interconnect structures in FPGAs are shown in U.S. Pat. No. 5,889,411 issued to Chaudhary et al. and pages 4–32 through 4–37 of the Xilinx 1996 Data Book entitled "The Programmable Logic Data Book" available from Xilinx, Inc., 2100 Logic Drive, San Jose, Calif. 95124. The Freeman reference, the Chaudhary reference, and the Data Book are incorporated herein by reference.

In addition to the structures discussed above, FPGAs also include structures for performing special functions. In particular, FPGAs include carry circuits and lines for connecting the carry output of one bit generated in one CLB to the carry input of another CLB, and cascade lines for allowing wide functions to be generated by combining several adjacent CLBs. Carry structures are discussed by Hsieh et al. in U.S. Pat. No. 5,267,187 and by New in U.S. Pat. No. 5,349,250.

Cascade structures are discussed by Goetting et al in U.S. Pat. No. 5,365,125 and by Chiang et al. in U.S. Pat. No. 5,357,153. These patents are also incorporated herein by reference.

As discussed by the above-incorporated references, each CLB may include one or more slices ("slice" or "CLB slice"). Each slice, in turn, includes at least one configurable function generator. The configurable function generator is typically implemented as a four-input lookup table (LUT). The incorporated references also point out that the carry circuits and cascade structures increase the speed at which the FPGA can perform certain functions, such as arithmetic functions.

FIG. 1A is a simplified block diagram of a conventional CLB 100. The illustrated CLB 100 includes a first slice 110 and a second slice 120. First slice 110 includes a first function generator G 112, a second function generator F 114, a third function generator 116, and an output control block 118. Output control block 118 may include multiplexers, flip-flops, or both. Four independent input terminals are provided to each of the G and F function generators 112 and 114. A single input terminal C1-in is provided to third function generator C1 116. Each of function generators 112 and 114 is typically implemented as a four-input LUT, and is capable of implementing any arbitrarily defined Boolean function of the inputs signals. Each of the input terminals may be assigned a number or a letter and referred to as a "literal." For example, in CLB 100, function generator 112 receives four input signals, or literals, G1, G2, G3, and G4. Function generator 116, typically implemented as a set of configurable multiplexers, is often used to handle carry bits, but can implement some Boolean functions of its three input signals C1-in, G', and F'. These Boolean functions include bypass, inverter, 2-input AND (product), and 2-input OR (sum). Signals G', F', and C1-out are multiplexed through output control block 118.

Output control block 118 provides output signal lines Y, QY, X, and QX. For this reason, output control block 118 may also be referred to as the "output multiplexer" or "output select multiplexer." Slice 110 may also provide the carry out signal, C1-out. Second slice 120 is similar to first slice 110. Accordingly, operations of second slice 120 are similar to the operations of first slice 110.

Accordingly, operations of second slice 120 are similar to the operations of first slice 110.

Operation of CLB 100 is also described by the incorporated references, and, in particular, in chapters seven and eight of the above-incorporated Data Book. For simplicity, CLB 100 of FIG. 1 is illustrated with two slices; however, the number of slices constituting a CLB is not limited to two.

FIG. 1B is a simplified block diagram of another conventional CLB 100a. CLB 100a is similar to CLB 100 of FIG. 1A but has an additional LUT 113. LUT 113 takes outputs of LUT 112 and 114 as well as another input K1 to slice 110a. Thus, LUT 113 allows slice 110a to implement any arbitrarily defined Boolean function of nine literals G1, G2, G3, G4, F1, F2, F3, F4, and K1. CLB 110a may include additional slices represented by ellipses 120a.

Technology mapping for LUT-based FPGAs involves decomposition of a circuit into combinational logic having nodes with 4-input ("fan-in") functions that can be realized in the LUTs of CLB slices. This is because, as shown in slice 110, the slices commonly include 4-input LUTs as their function generators. By conventionally specifying the functions of function generators F, G, and C1, and output control block 118, slice 110 can be programmed to implement various functions including, without limitation, two independent functions of up to four variables each.

Circuit designs are mapped to FPGAs as combinational logic. The combinational logic may be expressed in Boolean expressions including a number of logic levels and routing between the logic levels. The Boolean expressions include product (logical AND) and sum (logical OR) operations. Two levels of combinational logic may be expressed using sum-of-products (SOP) format. In fact, given a set of inputs and their inverse, any logic equation can be expressed using the SOP format.

In the FPGA art, there is a continuing challenge to increase speed (performance) of FPGA-implemented functions, or circuits. Circuit performance, or speed, is increased when circuit delay is decreased. Circuit delay includes two main components: logic delay and routing delay.

Using logical axioms and Boolean algebraic rules, it is possible to partially collapse a circuit design to reduce the number of logic levels, thus reducing the routing delay.

However, this creates wide fan-in nodes. The wide fan-in nodes require use of several levels of LUTs for implementation. This is because, as described above, the LUTs have limited fan-in, for example fan-in of four. Therefore, to implement wide fan-in nodes, multiple levels of CLBs must be used. The requirement to use multiple levels of CLBs increases the logic delay as well as creating other routing delays. These negative effects cancel out the benefits from the routing delay reduction provided by the partial collapse of the circuit design.

Accordingly, there is a need for a method to implement wide fan-in nodes in FPGAs while avoiding the negative effects described above. Additionally, there is a need for CLB and CLB slice designs that allow for fast implementation of wide fan-in SOP functions.

SUMMARY

According to one aspect of the present invention, there is provided a literal-sharing decomposition method for combinational logic circuits expressed as a sum of product terms. A first product term (P1) is combined with a second product term (P2) resulting in a product chain P1+P2 if P1 may be implemented in a number of configurable logic block (CLB) slices and the product chain P1+P2 may be implemented on the same number of configurable logic block (CLB) slices. The product chain is then used to configure CLB slices to implement the product terms. Because the product terms are combined, they can be implemented using fewer CLB slices than the number of slices needed for separate implementation. The reduction in the number of slices leads to faster implementation.

A "product chain" is a combination of product terms ("Pterms") that share one or more literals. A product chain would typically include at least two Pterms; however, a single Pterm may be designated as a product chain to which other Pterms may be combined. A Pterm or a product chain may be implemented on one or more CLB slices. A "slice chain" is one or more slices configured to implement a Pterm or a product chain.

The first step in the literal-sharing decomposition method is to identify the Pterm having the highest number of literals and defining it as a product chain. Second, from the remaining Pterms, the Pterm having the highest number of literals is selected. Third, if the selected Pterm fits any of the product chains, then the selected Pterm is combined with one of the product chains. If a fit is not found, then the selected Pterm becomes another product chain. Finally, the second and the third steps are repeated for the remaining Pterms until all Pterms have been examined.

Any sum-of-products (SOP) function can be represented using a "personality matrix" that expresses the logical behavior, or "personality," of the circuit. One embodiment of the literal-sharing decomposition process uses personality matrices to simplify the decomposition process. First, a personality matrix is formed for the combinational logic, the personality matrix having rows, each row representing a product term and showing the literals for the product term of that row. The rows are sorted in descending order based on the number of literals in each row.

The first row in the sorted personality matrix is defined as a product chain. Then, each row is analyzed as follows: (1) the following row is designated a current row; (2) a determination is made as to whether the current row fits into any product chain; (3) if the current row does not fit into any product chain, then the current row is designated as a new product chain; and (4) if the current row fits into an existing product chain, then the current row is combined into the existing product chain with the best fit.

According to a second aspect of the present invention, a technology mapping system is disclosed. The system has a processor and memory connected to the processor. The memory stores programs to instruct the processor to decompose combinational logic circuit expressed in sum-of-products format. The decomposition process is similar to the processes summarized in the preceding paragraphs and disclosed in detail in the following sections.

According to a third aspect of the invention, an article of manufacture for a computer is disclosed. The article may be a machine-readable storage device, such as computer memory, adaptable to hold a program for a processor. The program, when executed, causes the computer to perform the literal-sharing decomposition steps summarized in the preceding paragraphs and disclosed in detail in the following sections.

According to a fourth aspect of the invention a programmable logic device (PLD) is configured to implement a combinational logic circuit mapped to the PLD in accordance with the literal-sharing decomposition steps summarized in the preceding paragraphs and disclosed in detail in the following sections.

According to a fifth aspect of the invention, a CLB has two or more slices, each slice having an output. The CLB also includes a second-level circuit for combining the outputs from the slices.

According to a sixth aspect of the invention, a CLB has at least one slice. The slice has at least two configurable function generators receiving a plurality of inputs and generating, together, a first output. The slice also includes a combining gate for combining the first output with a combining gate input to generate a combining gate output wherein the combining gate input is an input to the first CLB slice and wherein combining gate output is an output of the first CLB slice.

According to a seventh aspect of the invention, a CLB has at least one slice. The slice has a first configurable function generator generating a first output, a second configurable function generator generating a second output, and a dedicated function generator for receiving the first output and the second output to generate a dedicated output. The dedicated function generator includes a first logic gate with an output, a second logic gate with an output, and a mutiplexer allowing selection between the two logic gate outputs.

According to an eighth aspect of the invention, a CLB has two or more slices. Each of the slices has a first configurable function generator generating a first output, a second configurable function generator generating a second output, and a dedicated function generator for receiving the first output and the second output to generate a dedicated output. The dedicated function generator includes a first logic gate and a second logic gate. The CLB also has a second-level circuit for combining the dedicated outputs from its slices.

Other aspects and advantages of the present invention will become apparent from the following detailed description, taken in conjunction with the accompanying drawings, illustrating by way of example the principles of the invention.

DETAILED DESCRIPTION

Figure 1A:
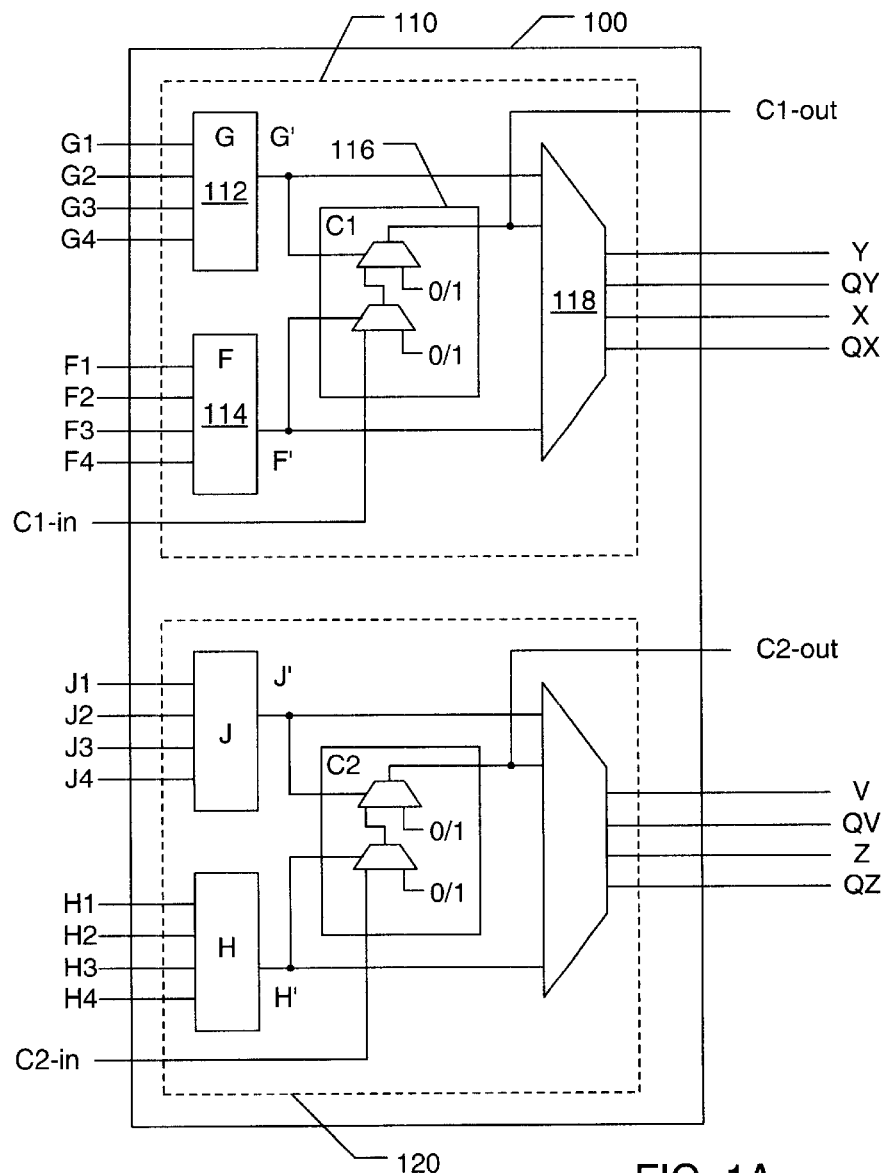
FIG. 1A illustrates a conventional configurable logic block (CLB)

As shown in the drawings, the invention is embodied in a method of decomposing wide-fan-in combinational logic circuit designs for implementation using configurable logic block (CLB) slices having low-fan-in LUTS. The decomposition technique is based on the fact that similar input patterns of the combinational logic may be shared among slices to reduce the number of LUTs required to implement the combinational logic. After the decomposition, the combinational logic can be implemented using fewer slices. Reducing the required number of slices improves area efficiency, and the resulting reduction in signal propagation delay improves speed performance.

CLBs in accordance with one embodiment of the invention are adapted to include dedicated logic to combine the outputs of CLB slices. The dedicated logic, which may be a "second-level logic circuit" in one embodiment, replaces look-up-table logic conventionally used to combine slice outputs when implementing wide fan-in functions. Reducing the need for look-up-table logic improves speed performance and reduces the number of slices required to implement many SOP expressions. In another embodiment, slices include the combining gate. In this case, the combining gate of a first slice may be serially connected to the combining gate of a second slice. Still other embodiments include slices with dedicated function generators in each slice. The dedicated function generators efficiently combine the outputs of respective first and second function generators.

$$EQ.1 = (\sim1.\sim3.\sim4.5.\sim E) + (\sim3.\sim4.5.\sim C.\sim E) +$$
$$(\sim3.\sim4.5.\sim D.\sim E) + (\sim3.\sim4.5.\sim E.\sim F) + (2.\sim3.\sim4.5.8.9.\sim E) +$$
$$(\sim3.\sim4.5.8.A.\sim B.\sim E) + (\sim3.\sim4.5.6.7.8.9.\sim E) =$$
$$P1 + P2 + P3 + P4 + P5 + P6 + P7$$

where
 $P1=(\sim1.\sim3.\sim4.5.\sim E)$;
 $P2=(\sim3.\sim4.5.\sim C.\sim E)$;
 $P3=(\sim3.\sim4.5.\sim D.\sim E)$;
 $P4=(\sim3.\sim4.5.\sim E.\sim F)$;
 $P5=(2.\sim3.\sim4.5.8.9.\sim E)$;
 $P6=(\sim3.\sim4.5.8.A.\sim B.\sim E)$; and
 $P7=(\sim3.\sim4.5.6.7.8.9.\sim E)$.

Equation EQ.1 can be expressed as a personality matrix, as shown below in TABLE 1. The columns of the personality matrix are associated with the inputs of a given function, each column corresponding to an input signal or line. The rows P1 through P7 of the personality matrix correspond to the product terms ("Pterms") of the circuit expressed as a sum-of-products. In the example of Table 1, Pterm P1 produces a logic one output if lines 1, 3, 4, and E express logic zeros and line 5 expresses a logic one. The remaining inputs lines, designated as "–" for Pterm P1, are "don't care" bits, and do not affect the result. The Pterm results for each Pterm P1–P7 are summed (i.e., AND'ed) to generate an output result of the combinational logic circuit. Therefore, the number of inputs, or variables, in the SOP expression equals the number of columns, and the number of Pterms equals the number of rows of the corresponding personality matrix.

TABLE 1

(PERSONALITY MATRIX OF EQ. 1)

| Pterms | Input Lines | | | | | | | | | | | | | | | Pterm Result |
|---|---|---|---|---|---|---|---|---|---|---|---|---|---|---|---|---|
|  | 1 | 2 | 3 | 4 | 5 | 6 | 7 | 8 | 9 | A | B | C | D | E | F |  |
| P1 | 0 | — | 0 | 0 | 1 | — | — | — | — | — | — | — | — | 0 | — | 1 |
| P2 | — | — | 0 | 0 | 1 | — | — | — | — | — | — | 0 | — | 0 | — | 1 |
| P3 | — | — | 0 | 0 | 1 | — | — | — | — | — | — | — | 0 | 0 | — | 1 |
| P4 | — | — | 0 | 0 | 1 | — | — | — | — | — | — | — | — | 0 | 0 | 1 |
| P5 | — | 1 | 0 | 0 | 1 | — | — | 1 | 1 | — | — | — | — | 0 | — | 1 |
| P6 | — | — | 0 | 0 | 1 | — | — | 1 | — | 1 | 0 | — | — | 0 | — | 1 |
| P7 | — | — | 0 | 0 | 1 | 1 | 1 | 1 | 1 | — | — | — | — | 0 | — | 1 |

Section 1: Literal-Sharing Decomposition

For purposes of explaining the literal-sharing decomposition technique of the present invention, a sample combinational logic circuit having fifteen input signals and one output signal is used. The sample combinational logic circuit may be described using a Boolean expression shown as EQ.1 below where the fifteen input signals are represented by numbers 1 through F, each having one of two Boolean values 0 or 1. EQ.1 below expresses the sample combinational logic circuit in SOP format using conventional logic symbols including "+" for the OR operation, "." for the AND operation, and "~" for the NOT operation. For convenience, the Pterms are referred to as P1, P2, . . . P7. Pterms P1, P2, P3, and P4 have five literals each, Pterms P5 and P6 have seven literals each, and Pterm P7 has eight literals.

The personality matrix for the sample circuit EQ.1 is relatively sparse. That is, the number of literals of the personality matrix is relatively low compared to the total number of input signals. Experimental results show that sparse personality matrices are common for combinational logic circuits.

To implement EQ.1 under the current art, each of the Pterms must be implemented in its own CLB slice. This is because each Pterm has five to eight input signals, or fan-ins. In addition, the sum operation (to sum the Pterm results) must be implemented within another slice, bringing the total number of the required slices to eight. Thus, implementation of the above example would require four CLBs each having two slices or two CLBs each having four slices.

A decomposition technique in accordance with the invention reduces the number of slices required to implement the sample personality matrix by combining Pterms. This is possible because Pterms may share literals and patterns of literals. Sharing of literals allows Pterms to share slices, resulting in more efficient use of resources. In one embodiment, Pterms are summed if the resultant product chain can be implemented using the same number of slices as one of the summed Pterms. A "product chain" is a combination of Pterms that share one or more literals. A product chain would typically include at least two Pterms; however, a single Pterm may be designated as a product chain with which other Pterms may be combined. A Pterm or a product chain may be implemented on one or more CLB slices. A "slice chain" is one or more slices configured to implement a Pterm or a product chain.

Figure 2:
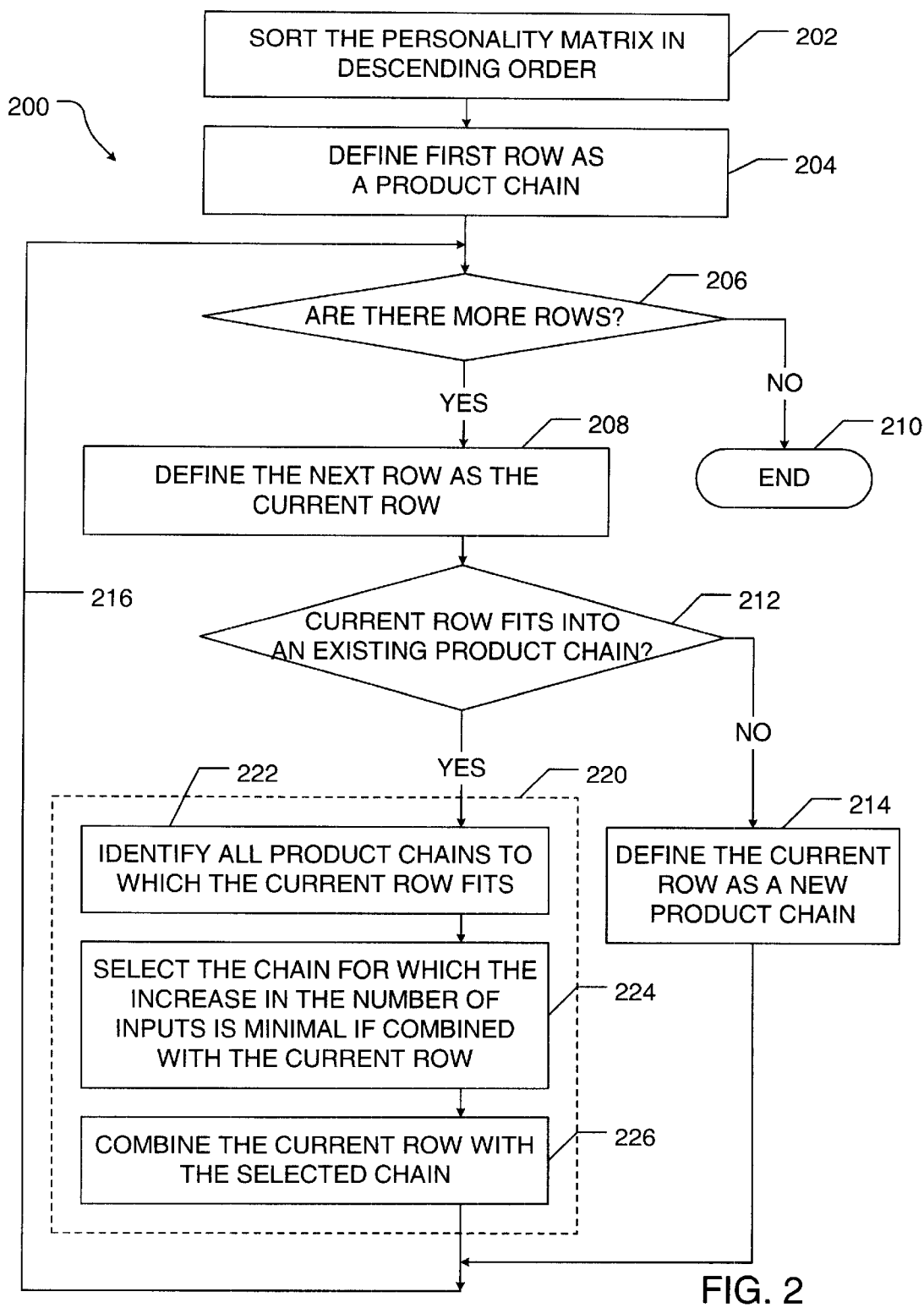
FIG. 2 is a flowchart illustrating a process of decomposing combination logic by sharing literals.

FIG. 2 is a flowchart 200 illustrating the process of decomposing a wide fan-in circuit design expressed in SOP format. Circuit designs expressible in SOP format are also expressible in Berkeley Logic Interchange Format (BLIF) using a "personality matrix." To share the literal patterns, first the personality matrix is sorted in descending order based on the number of literals present for each Pterm (operation 202) (The sorting process may not be required.) Then, the first Pterm is identified as a first product chain. The remaining Pterms are analyzed in the sorted order as discussed below.

TABLE 2 illustrates a result of the sorting operation performed on the expression of TABLE 1. Pterm P7 has the highest number of literals (eight), and therefore moves to the top of the personality matrix. The next two Pterms are Pterms P5 and P6, each having seven literals. Pterms P1, P2, P3, and P4 follow with five literals each.

Next, each remaining row is examined (decisions and operations from 206 through 226 of FIG. 2) in turn, to determine whether the row being examined (the "current row") fits into any existing product chain (decision 212). Each remaining row is analyzed as follows:

The next row is defined as the current row for examination (operation 208). The current row is examined to determine whether the current row fits into any of the existing product chains (decision 212). The current row fits into a product chain if the combined product chain (the product chain + the current row) can be implemented on the same number of slices as the product chain itself.

Figure 3A:
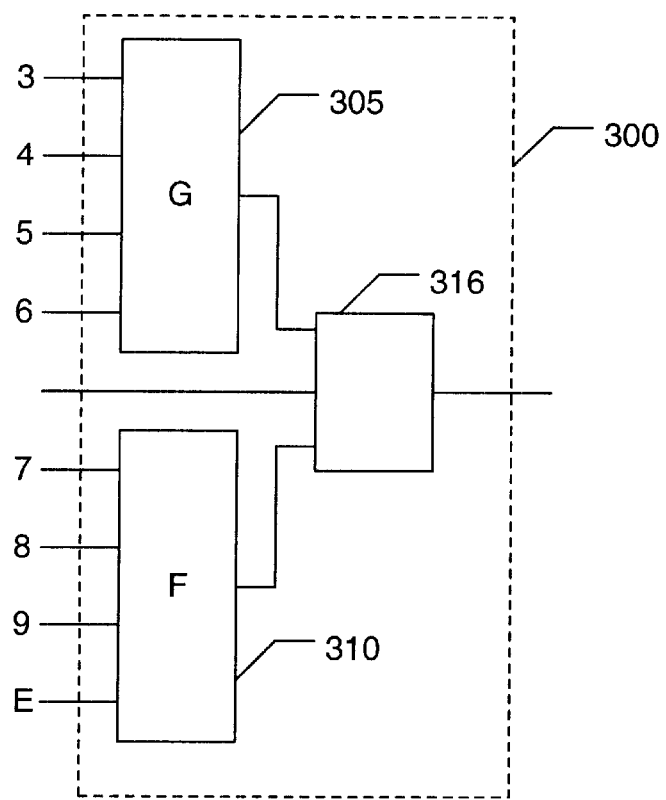
FIG. 3A illustrates a CLB slice configured to implement a sample product term.

Returning to the example, at decision operation 212 of FIG. 2, the current row is Pterm P5 and the only existing product chain consists of Pterm P7. As shown in FIG. 3A, the Chain P7 can be implemented on a single slice 300. Pterm P5 fits Chain P7 if the combination of Chain P7 and Pterm P5 (hereinafter "Chain P7+P5") can be implemented on a single slice.

Figure 3B:
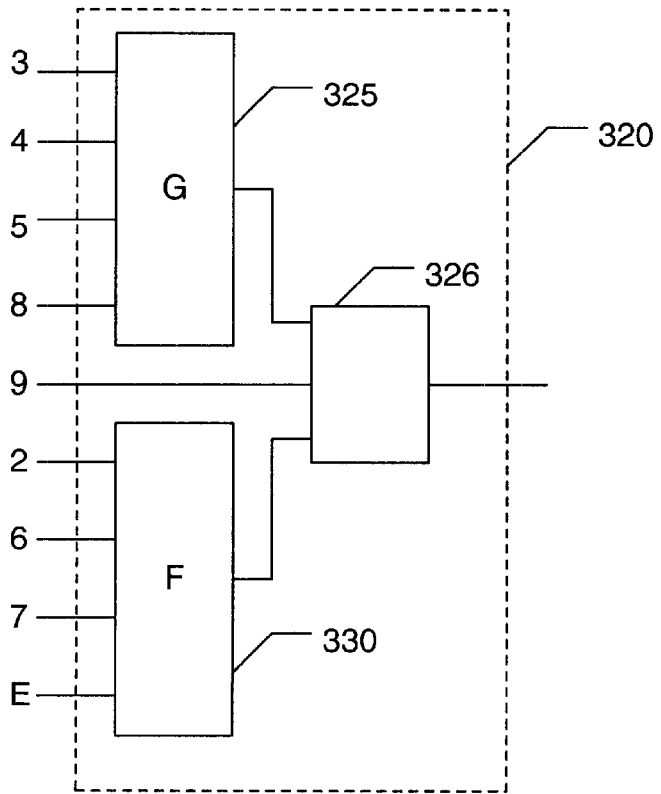
FIG. 3B illustrates a CLB slice configured to implement a sample product chain.

Here, Chain P7+P5 can be implemented on a single slice 300 as shown in FIG. 3B. Chain P7+P5 can be implemented on a single slice because Chain P7+P5 requires only nine literals. Even though Chain P7 requires eight literals and Pterm P5 requires seven literals, six literals are common between Chain P7 and Pterm P5, leaving only three non-shared literals. To share the literals, both the literals and the functions of the shared literals must be shared.

Pterms P7 and P5 share literals 3, 4, 5, 8, 9, and E. That is, both Pterms P7 and P5 use literals 3, 4, 5, 8, 9, and E in the same way to determine their respective results.

TABLE 2

(SORTED PERSONALITY MATRIX)

| $n^{th}$ Row | Pterm | Input Lines | | | | | | | | | | | | | | | Result |
|---|---|---|---|---|---|---|---|---|---|---|---|---|---|---|---|---|---|
| | | 1 | 2 | 3 | 4 | 5 | 6 | 7 | 8 | 9 | A | B | C | D | E | F | |
| 1 | P7 | — | — | 0 | 0 | 1 | 1 | 1 | 1 | 1 | — | — | — | — | 0 | — | 1 |
| 2 | P5 | — | 1 | 0 | 0 | 1 | — | — | 1 | 1 | — | — | — | — | 0 | — | 1 |
| 3 | P6 | — | — | 0 | 0 | 1 | — | — | 1 | — | 1 | 0 | — | — | 0 | — | 1 |
| 4 | P1 | 0 | — | 0 | 0 | 1 | — | — | — | — | — | — | — | — | 0 | — | 1 |
| 5 | P2 | — | — | 0 | 0 | 1 | — | — | — | — | — | — | 0 | — | 0 | — | 1 |
| 6 | P3 | — | — | 0 | 0 | 1 | — | — | — | — | — | — | — | 0 | 0 | — | 1 |
| 7 | P4 | — | — | 0 | 0 | 1 | — | — | — | — | — | — | — | — | 0 | 0 | 1 |

The first row, P7, is defined as a new product chain (operation 204). Here, the product chain P7, "Chain P7," requires one slice having two four-input LUTs for implementation.

FIG. 3A illustrates a portion of a conventional slice 300 configured to implement the product expressed by Chain P7. Slice 300 includes a pair of four-input LUTS 305 and 310 and carry logic 316. The input terminals of LUTs 305 and 310 are connected to like-numbered input terminals identified in the matrices of Tables 1 and 2. Carry logic 316 is used as an AND gate having input terminals connected to the respective output terminals of LUTs 305 and 310.

LUTs 305 and 310 can be combined with carry logic 316 to perform logic functions of up to nine literals. Chain P7 has fewer than nine literals. Therefore, Chain P7 can be implemented in one slice. At this stage of the decomposition process, Chain P7 is the only existing product chain and consists of only one Pterm P7.

Referring to FIG. 3B, slice 320 implements chain P7+P5 by configuring a first LUT 325 to implement shared literals 3, 4, 5, and 8. A second LUT 330 is configured to implement non-shared literals 2, 6, and 7 as well as to implement one shared literal E. Non-shared literals are literals that are not common to the Pterms or product chains being compared. Finally, the remaining shared literal 9 is implemented using carry circuit 326. In order to combine a Pterm to a product chain, the number of non-shared literals between the Pterm and the product chain must be less than or equal to the number of inputs of a LUT. In the present example, this number is four.

In general, a row fits into a product chain if either of the following two criteria is met:

(1) the carry circuit of a slice configured to implement the product chain is used as an OR gate; and the row can be added to one of the LUTs (that is, the composite number of literal inputs to the row and the LUT is less than or equal to 4); or (2) the carry circuit of a slice configured to implement the product chain is used as an AND gate; and the number of non-shared literals between the product chain and the row is 4 or less.

Using these criteria, the relationship between Chain P7 and Pterm P5 may be examined in detail. After the operations 202 to 208 of FIG. 2, Chain P7 is the only product chain. Chain P7, having eight literals, may be implemented on a single slice having two LUTs, as depicted in FIG. 3A. Carry circuit 316 in this case must be an AND gate to perform the product function on the input lines. Because P7 only has eight literals, the ninth input, the carry input, is not used. Slice 310 also includes a programmable output control block; however, to avoid clutter, the output control block is not illustrated in the figure.

Referring again to FIG. 2 and continuing to refer to FIG. 3A, next, the second row, Pterm P5, becomes the current row (operation 208). To determine whether the current row fits Chain P7 (decision 212), the above-described two criteria are examined. In this case, because carry circuit 316 of Chain P7 is an AND gate, the criterion (1) is not met. The current row fits Chain P7 under the criterion (2) because carry circuit 316 of Chain P7 is an AND gate and the number of non-shared literals is only three.

Here, Chain P7 and Pterm P5 share literals 3, 4, 5, 8, 9, and E. Chain P7 and Pterm P5 do not share literals 2, 6, and 7. The relationship between Chain P7 and Pterm P5 may be expressed using the SOP format and logic symbols as:

(Chain P7) OR (Pterm P5) =

$$(\sim 3.\sim 4.5.6.7.8.9.\sim E) + (2.\sim 3.\sim 4.5.8.9.\sim E)$$

factoring out the shared literals results in $$= (\sim 3.\sim 4.5.8.9.\sim E).((6.7) + 2)$$

$$= \text{shared literals.(sum of non-shared literals)}$$

There are only three non-shared literals—2, 6, and 7. This fact, combined with the fact that carry circuit 316 of Chain P7 is an AND gate, satisfies criterion (2). Accordingly, P5 fits Chain P7 (operation 212).

If the current row fits at least one of the existing product chains, then the current row is combined into the product chain (operation 220). If there is no product chain to which the current row fits, then the current row becomes a new product chain (operation 214).

In this example, the current row, P5, fits Chain P7. In the next step, step 222, all product chains to which the current row fits are identified. Here, there is only one product chain, Chain P7. However, if multiple product chains are identified as fitting the current row of the Pterm, then the optimal product chain is selected by selecting the product chain for which increase in the number of inputs is minimal if combined with the current row (operation 224).

Following the selection of the product chain, the current row is combined into the selected product chain (operation 226). In this present example, Chain P7 and Pterm P5 are combined to create a new product chain, Chain P7+P5 (operation 226). TABLE 3 below shows Chain P7+P5. Note that, with nine input literals, implementation of Chain P7+P5 requires the use of the carry circuit.

TABLE 3

(Chain P7+P5)

| | Input Lines | | | | | | | | | | | | | | |
|---|---|---|---|---|---|---|---|---|---|---|---|---|---|---|---|
| Chain | 1 | 2 | 3 | 4 | 5 | 6 | 7 | 8 | 9 | A | B | C | D | E | F |
| P7+P5 | — | 1 | 0 | 0 | 1 | 1 | 1 | 1 | 1 | — | — | — | — | 0 | — |

As indicated by loop 216, the above-described process is repeated for each of the remaining rows. For example, the next current row is row 3, Pterm P6 (operation 208). Then, P6 is compared with Chain P7+P5 to determine the fit at operation 212. P6 does not fit Chain P7+P5 because P6 requires two more literals, A and B, and chain P7+P5 can not accommodate any more literals and still fit within the same number of slices. Accordingly, a new product chain, Chain P6 is defined (operation 214).

Next, the 4$^{th}$ row of the sorted matrix, Pterm P1, becomes the current row (operation 208). Then, P1 is compared with Chain P7+P5 and with Chain P6 to determine the fit at operation 212. P1 fits Chain P6 under criterion (2). Thus, P1 is combined with Chain P6 to generate Chain P6+P1 (operation 220).

These operations are repeated until no more rows are remaining in the sorted matrix. The process then terminates as indicated by terminator 210 of the flowchart 200.

Analysis of the sorted matrix TABLE 2 under the present technique results in the product chains listed in TABLE 4.

TABLE 4

(RESULTANT PRODUCT CHAINS)

| | Input Lines | | | | | | | | | | | | | | |
|---|---|---|---|---|---|---|---|---|---|---|---|---|---|---|---|
| Chain | 1 | 2 | 3 | 4 | 5 | 6 | 7 | 8 | 9 | A | B | C | D | E | F |
| P7+P5 | — | 1 | 0 | 0 | 1 | 1 | 1 | 1 | 1 | — | — | — | — | 0 | — |
| P6+P1 | 0 | — | 0 | 0 | 1 | — | — | 1 | — | 1 | 0 | — | — | 0 | — |
| P2+P3+P4 | — | — | 0 | 0 | 1 | — | — | — | — | — | — | 0 | 0 | 0 | 0 |

Figure 4A:
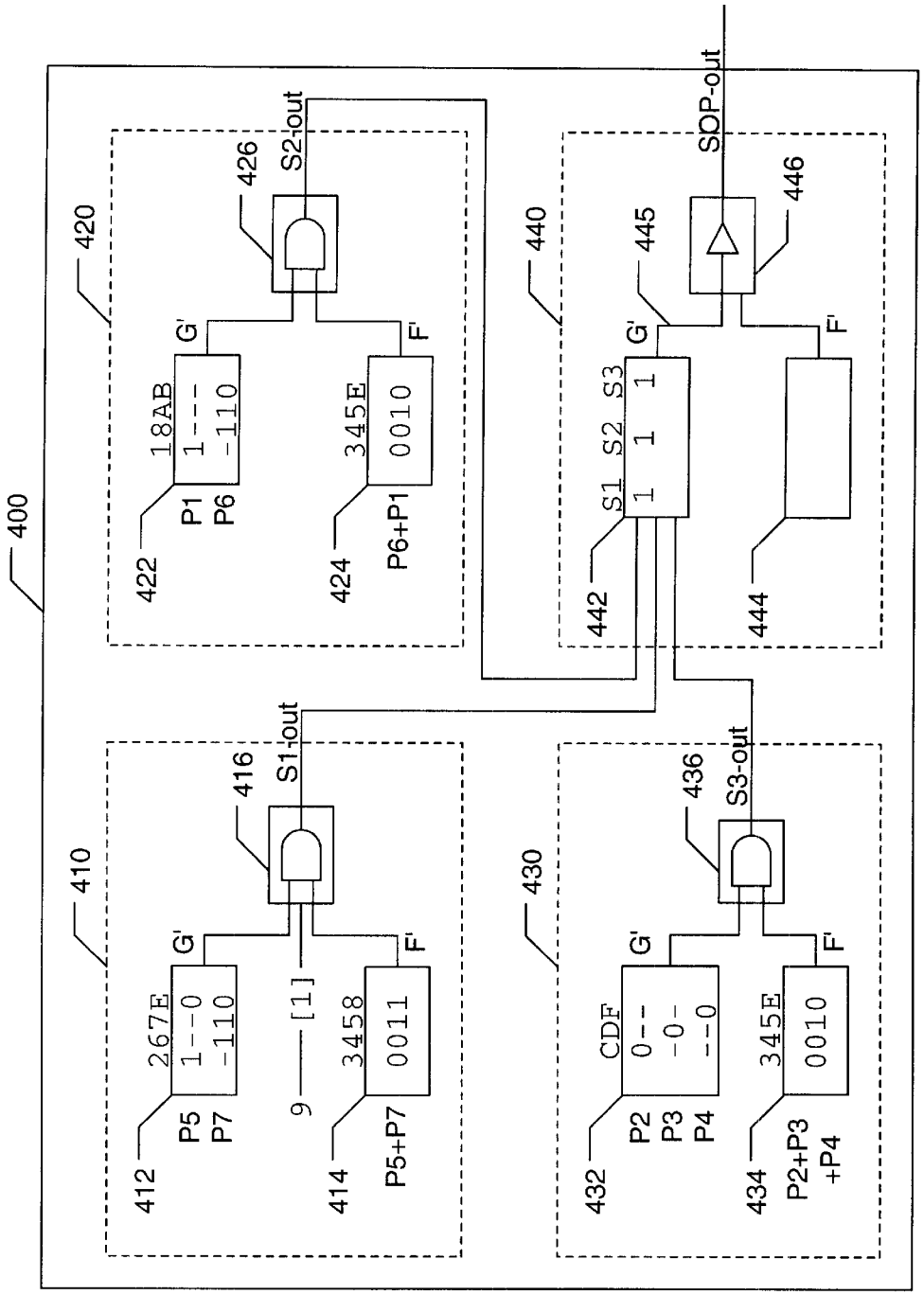
FIG. 4A illustrates a CLB implementation of a sample combinational logic circuit.

FIG. 4A illustrates a CLB 400 implementing the product chains listed in TABLE 4. CLB 400 includes four slices 410, 420, 430, and 440. First slice 410 is configured to implement Chain P7+P5. The non-shared literals—literals 2, 6, and 7—and one of the shared literals, E, are implemented using a LUT 412. The remaining five shared literals—literals 3, 4, 5, 8, and 9—are implemented using a combination of a LUT 414 and a carry circuit 416. First slice 410 generates a sum of the Pterms for P7 and P5 as its output, S1-out.

First and second configurable function generators 412 and 414 are commonly implemented using look-up-tables (LUTs). Third configurable function generator 416 is typically a set of multiplexers, flip-flops, or both, designed to handle carry bits but also configurable to perform as a bypass, an inverter, an AND gate, or an OR gate.

Second slice 420 is configured to implement Chain P6+P1. The non-shared literals—1, 8, A, and B—are implemented using LUT 422. The shared literals—3, 4, 5, and E—are implemented using LUT 424. Carry circuit 426 is used as an AND gate to generate a product of the outputs of LUTs 422 and 424. Second slice 420 generates a sum of the Pterms for P1 and P6 as its output, S2-out.

Third slice 430 is configured to implement Chain P2+P3+P4. The non-shared literals—literals C, D, and F—are implemented using LUT 432. The shared literals—literals 3, 4, 5, and E—are implemented using LUT 434. Carry circuit 436 is used as an AND gate to generate a product of the outputs of LUTs 432 and 434. Third slice 430 generates a sum of the Pterms for P2, P3, and P4 as its output, S3-out.

For the sample combinational logic circuit represented by equation EQ.1, carry circuits 416, 426, and 436 are utilized for the logical AND function. However, as already discussed, the carry circuits may be adapted as a bypass, an inverter, an AND gate, or an OR gate.

To complete the sum-of-products function of the sample circuit represented by equation EQ.1, fourth slice 440 may be configured to sum the outputs from the previous three slices 410, 420, and 430. For the sum function, LUT 442 may be configured to take the three slice outputs—S1-out, S2-out, and S3-out—as input to generate a sum 445. Here, LUT 444 is not used, and carry circuit 446 may be used as a bypass circuit. Thus, the resultant signal of fourth slice 440 becomes the output of CLB 400, SOP-out.

Figure 4B:
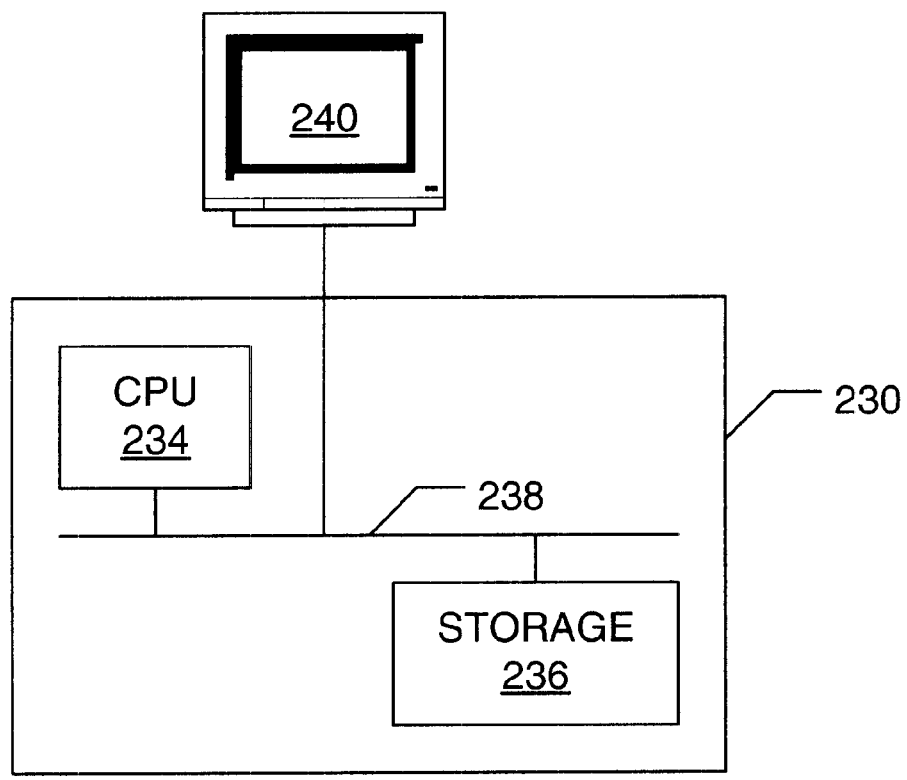
FIG. 4B illustrates a computing system programmed to perform literal-sharing decomposition of combinational logic.

FIG. 4B illustrates a computing system 230 having a processor 234 and storage 236. Storage 236 may be connected to processor 234 via a bus 238. Storage 236 includes a program that, when executed by the processor 234, causes system 230 to decompose combinational logic circuits expressed in sum-of-products format. The program implements the literal-sharing decomposition technique discussed above.

System 230 may be connected to a display 240 for user interface. Storage 236 may be computer memory such as random access memory (RAM) or more permanent storage such as magnetic, optical, or other forms of machine storage.

As described, the literal-sharing decomposition allows combinational logic to be implemented using a reduced number of CLB slices. This reduction leads to reductions in both the logic delay and the routing delay, thus increasing the circuit performance. Moreover, the reduction in the number of required CLB slices saves FPGA area. In summary, applying literal-sharing decomposition techniques leads to faster implementation of logic circuits.

Section 2: CLB with a Second-level Logic Circuit

The performance of the combinational logic circuits implementing sum-of-product functions may be further increased by adding a second-level logic circuit to a CLB.

Figure 5:
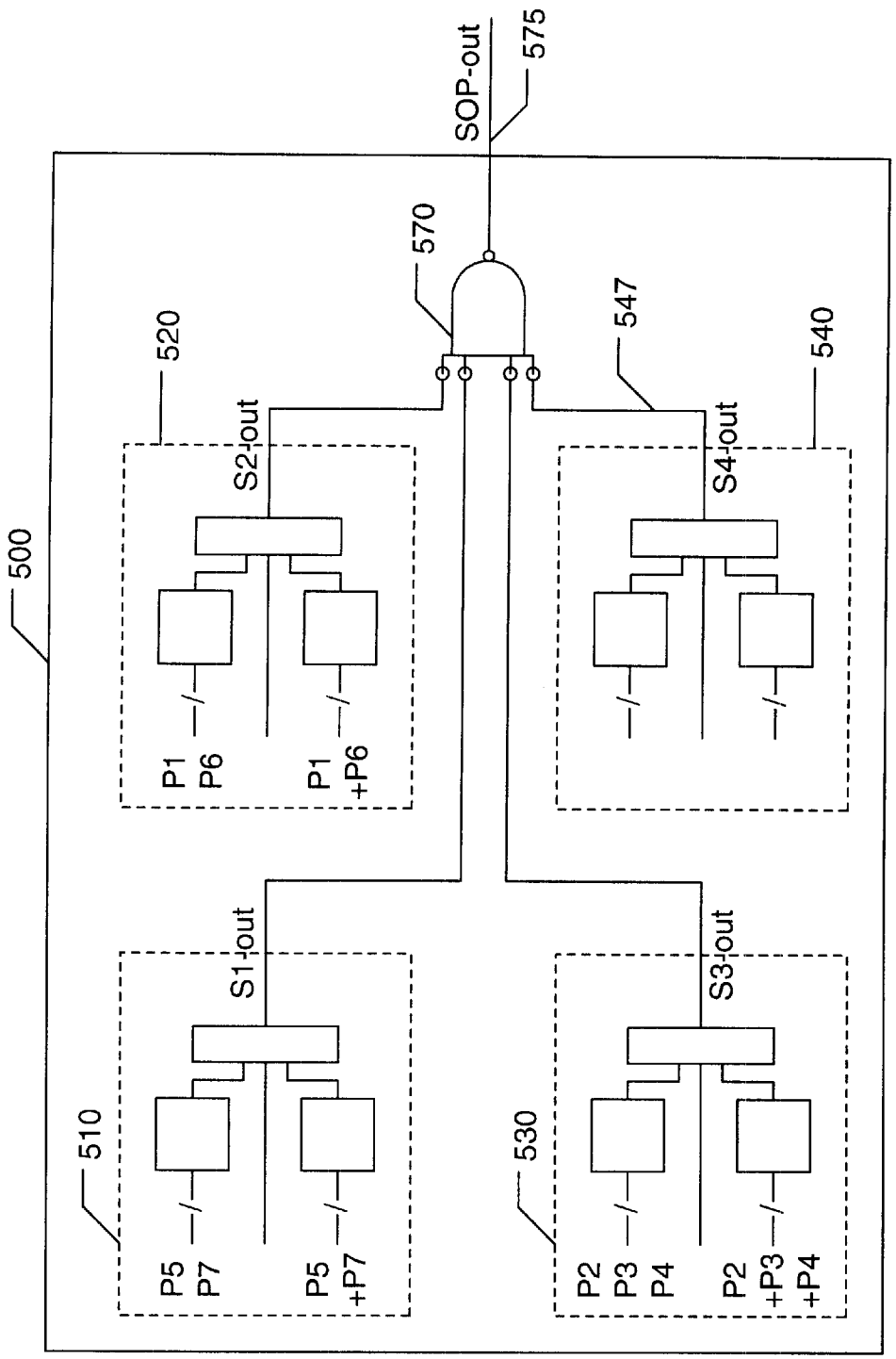
FIG. 5 illustrates one embodiment of a CLB in accordance with the present invention, including a second-level logic circuit.

FIG. 5 illustrates a CLB 500 having four slices 510, 520, 530, and 540. CLB 500 also includes a second-level logic circuit 570. In the depicted embodiment, second-level logic circuit 570 is separate from slices 510, 520, 530, and 540.

In one embodiment, second-level circuit 570 may be an OR gate or its logical equivalent such as an inverted-input NAND gate (NND4) 570 as illustrated. Second-level circuit 570 preferably has the same number of inputs as the number of slices in CLB 500, four in the illustrated CLB 500.

To aid the discussion, CLB 500 is configured to implement the sample combination logic circuit represented by equation EQ.1 and the personality matrix of TABLE 1. First slice 510 implements Chain P5+P7 and generates S1-out, the sum of Pterms P7 and P5. Second slice 520 implements Chain P1+P6 and generates S2-out, the sum of Pterms P1 and P6. Third slice 530 implements Chain P2+P3+P4 and generates S3-out, the sum of Pterms P2, P3, and P4. NND4 circuit 570 sums the three outputs—S1-out, S2-out, and S3-out—to generate the final sum-of-products signal 575. Fourth slice 540 is not used in the present example.

The advantages of the present CLB design are numerous. First, NND4 circuit 570 frees up fourth slice 540, allowing CLB 500 to handle even wider fan-in nodes. Second, for combinational logic designs requiring all four slices to implement its Pterms, NND4 circuit 570 eliminates the need for another CLB slice that would have been required to perform the sum function but for NND4 circuit 570. Using another CLB slice would have increased the logic delay, the routing delay, and the area requirement. Finally, even for combinational logic that fits entirely within a single CLB, such as the case with the sample combinational logic circuit represented by equation EQ.1, NND4 circuit 570 increases the performance of the circuit because NND4 circuit 570 uses dedicated hardware, and therefore performs the sum operation faster than a configured LUT.

CLB 500 of FIG. 5 includes four slices 510, 520, 530, and 540. However, the CLB may contain any number of slices.

Section 3: CLB Slices with Combining Gate

Figure 6:
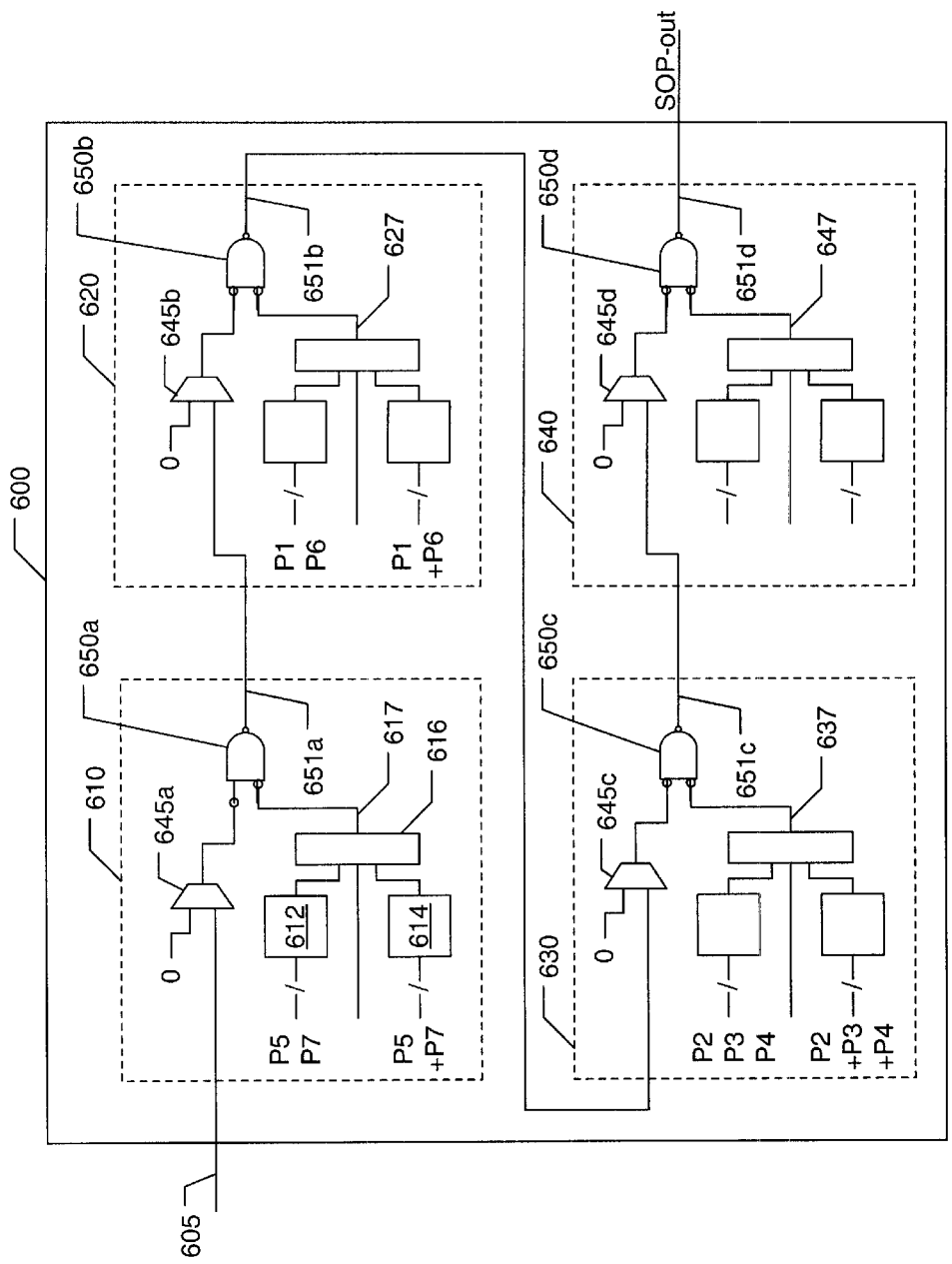
FIG. 6 illustrates an alternative embodiment of a CLB in accordance with the present invention, including a second-level logic circuit within CLB slices.

FIG. 6 illustrates an alternative embodiment of a CLB 600 for implementing SOP expressions. CLB 600 includes four similar slices 610, 620, 630, and 640. Each of the four slices 610, 620, 630, and 640 of the CLB 600 includes a combining gate in addition to the configurable function generators already discussed above.

Slice 610 includes configurable function generators 612, 614, and 616. As already discussed, configurable function generators 612 and 614 may be implemented as LUTs, and configurable function generator 616 may be implemented using multiplexers, flip-flops, or both. Configurable function generators 612, 614, or 616 receive a plurality of inputs and generate an output 617 which may be routed to one of two inputs of a combining gate 650*a*. In the one embodiment, combining gate 650*a* is a two-input OR gate (or a two-input NAND gate with inverted inputs, "NND2"). NND2 circuit 650*a* combines the output 617 with a combining gate input 605. Combining gate input 605 may be from a previous CLB or a previous slice. Application of combining gate input signal 605 may be controlled using a multiplexer 645*a*. If combining gate input 605 is neither available nor needed, then multiplexer 645*a* may be programmed to pass a zero value rather than combining gate input 605. NND2 circuit 650*a* generates an output 651*a* that is, in this configuration, a sum of its two inputs.

Other slices 620, 630, and 640 are likewise designed, each having their respective combining gates connected in series within the combining gate of a previous slice. That is, output 651*a* of NND2 circuit 650*a* of first slice 610 is the combining gate input to NND2 circuit 650*b* of second slice 620. NND2 circuit 650*b* generates output signal 651*b*. The signal 651*b* of NND2 circuit 650*b* of second slice 620 is the combining gate input to NND2 circuit 650*c* of third slice 630. NND2 circuit 650*c* generates output signal 651*c*. The signal 651*c* of NND2 circuit 650*c* of third slice 630 is the combining gate input to NND2 circuit 650*d* of fourth slice 640. NND2 circuit 650*d* generates output signal 651*d*. These serially connected combining gates at each slice sum the respective Pterm of the slice and all the Pterms of the preceding slices. Accordingly, output signal 651*d* of fourth slice 640 is the sum of all the Pterms of the combinational logic being implemented. The serial connection inputs of NND2 gates 650*a*, 650*b*, 650*c*, and 650*c*, may be controlled by multiplexers 645*a*, 645*b*, 645*c*, and 645*d*, respectively, as discussed above in reference to multiplexer 645*a*.

This alternative embodiment of CLB 600 allows multiple CLBs to be connected serially to implement very wide fan-in nodes. This is possible because every slice of CLB 600 includes a combining gate, each taking a combining gate input. Moreover, the alternative embodiment of CLB 600 may have manufacturing advantages because the combining gates exist within the slices, not separated from the slices. This allows the slices to be identical, making the circuit easier to scale.

As illustrated, CLB 600 of FIG. 6 includes four slices 610, 620, 630, and 640. However, CLB 600 may contain any number of slices and still provide advantages of the present invention.

Section 4: Dedicated Function Generator

Figure 1B:
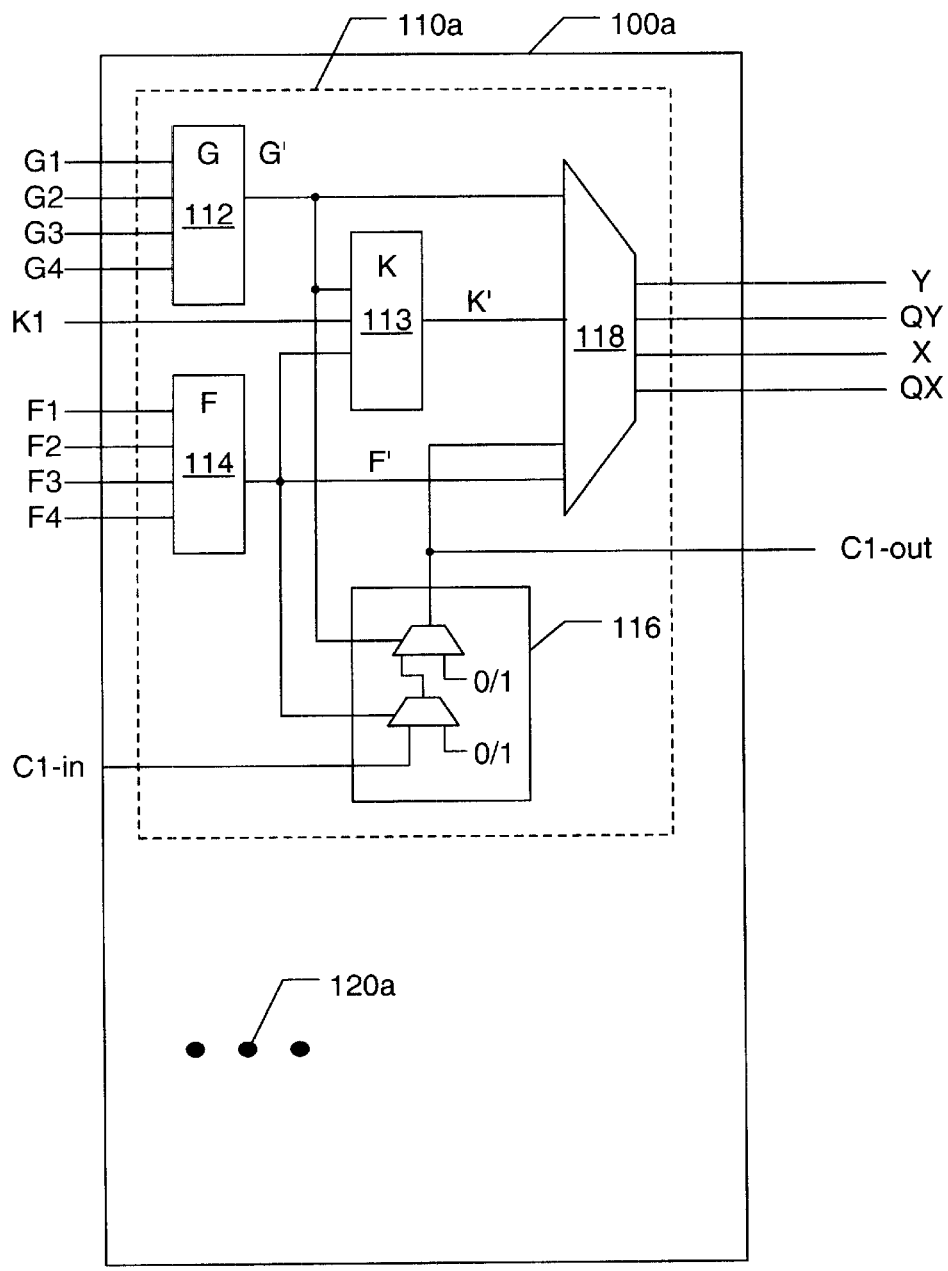
FIG. 1B illustrates another conventional configurable logic block (CLB)

The performance of the FPGA-implemented circuits may be increased even further by using a dedicated function generator (instead of a third LUT or a third function generator (the carry circuit)) to combine the results from the first two function generators (LUTs). As illustrated in FIGS. 1A and 1B, a third LUT 113 of FIG. 1B or a third function generator (carry circuit) 116 of FIG. 1A may be used as a bypass, an inverter, an AND gate, or an OR gate.

Figure 7A:
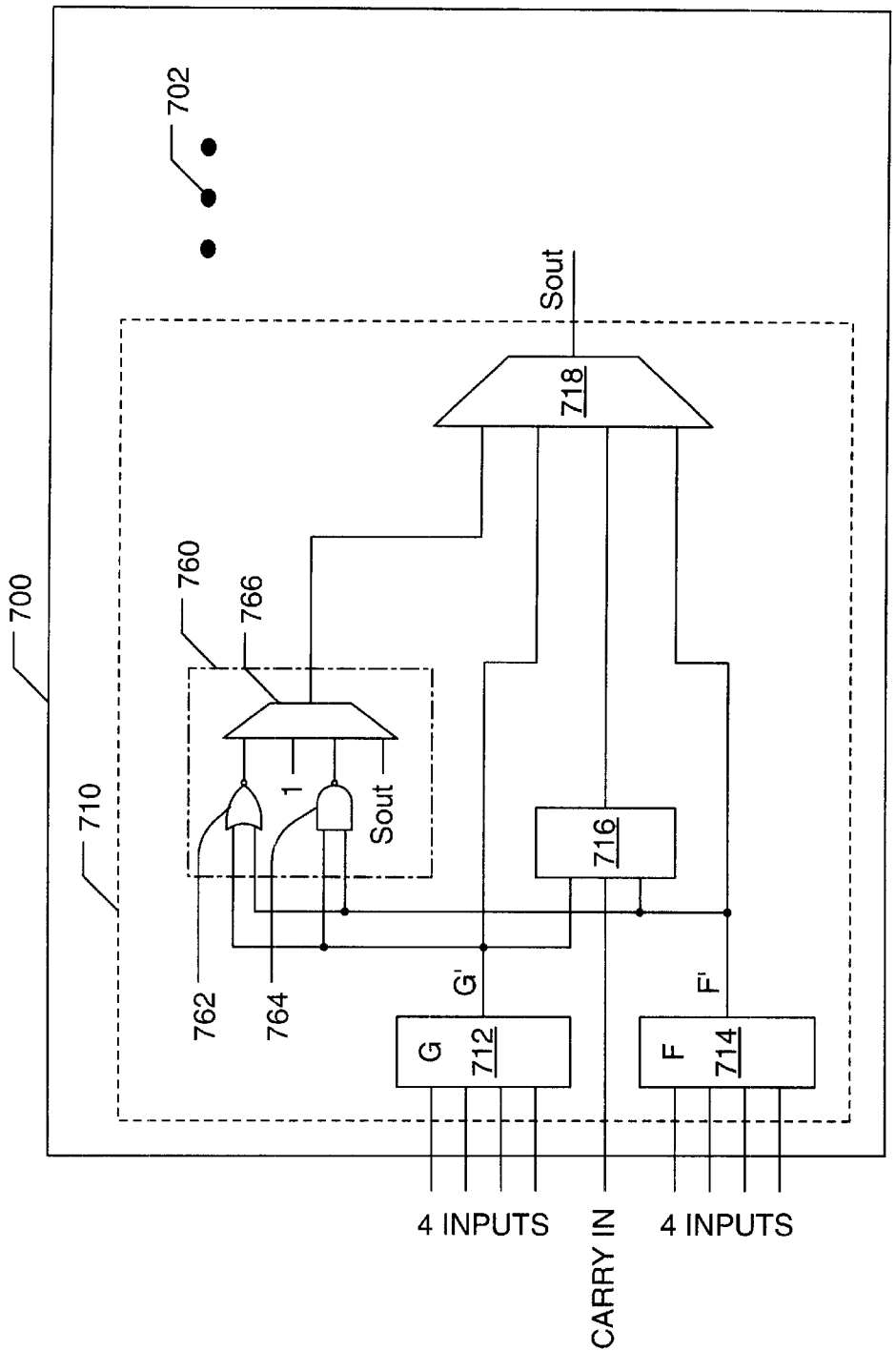
FIG. 7A illustrates another embodiment of a CLB in accordance with the present invention, including a dedicated function generator within each slice.

The same four operations—bypass, invert, AND, or OR—can be performed faster if a dedicated function generator is used. FIG. 7A depicts a portion of a CLB 700, including a slice 710 having a dedicated function generator 760. Only first slice 710 of CLB 700 is shown; the remaining slices are the same and are omitted for simplicity.

Slice 710 includes first and second function generators (LUTs) 712 and 714, third function generator (carry circuit) 716 and output control block 718. First LUT 712 is designated G and generates output G'. Second LUT 714 is designated F and generates output F'. Dedicated function generator 760 of slice 710 includes a two-input NOR 762, a two-input NAND 764, and a function select multiplexer 766. NAND gate 764 provides product F'.G'. NOR gate 762 provides sum F'+G'. The product and the sum are inputs to function select multiplexer 766. Function select multiplexer 766 may be configured to select the product or the sum as its output. With additional inputs signals 1 and Sout, function select multiplexer 766 can also serve as a bypass or an inverter. Mutiplexer 766 determines the output of dedicated function generator 760. The Sout input of multiplexer 766 allows the slices of CLB 700 to be serially connected to accommodate implementation of very wide functions. Because dedicated function generator 760 is implemented using dedicated gates, it requires less space and operates much faster than a LUT based implementation such as LUT 113 of FIG. 1B.

Figure 7B:
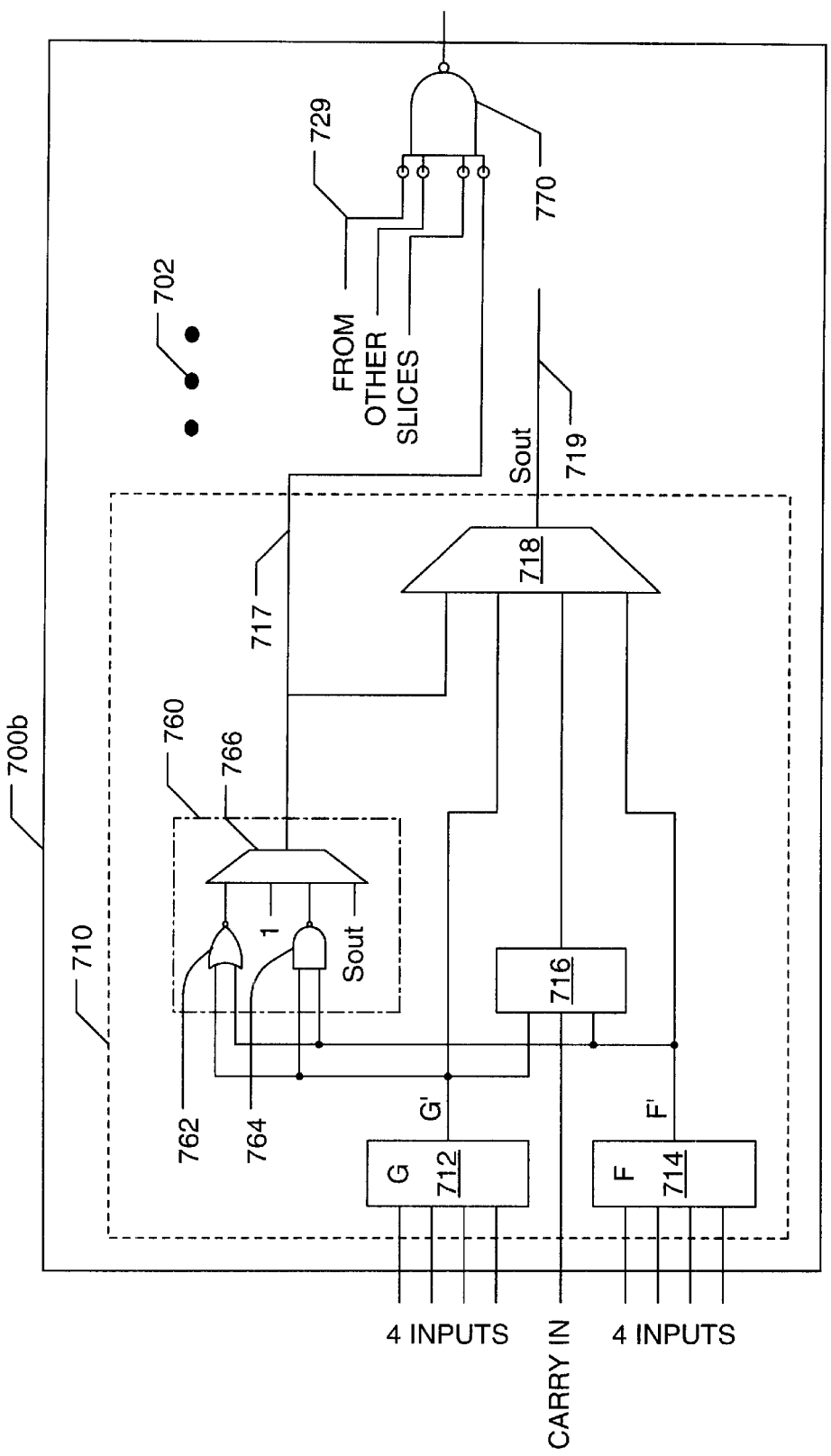
FIG. 7B illustrates a CLB having both a dedicated function generator within each slice and a second-level logic circuit within the CLB.

Section 5: Combining Slices with Dedicated Function Generator and CLB Second-Level Logic An embodiment of the present invention having an alternative design is shown in FIG. 7B. Portions of this embodiment are similar to those shown in FIGS. 7A and 5. For convenience, components in FIG. 7B that are similar to components in FIGS. 7A or 5 are assigned the same reference numerals, analogous but changed components are assigned the same reference numerals accompanied by letter "b," and different components are assigned different reference numerals.

A CLB 700*b* includes a slice 710 having a dedicated function generator 760 and having an output Sout 719. CLB 700*b* further includes a second-level logic circuit 770 that combines the outputs 719 and 729. Second-level logic circuit 770 operates as discussed in Section 2 above and in connection with FIG. 5. In this implementation, output 717 of dedicated function generator 760 bypasses output control block 718 to connect directly with second-level logic circuit 770. This implementation leads to even faster operation of the CLB 700*b*. CLB 700*b* may include other slices or circuits as indicated by ellipsis 702, each of the other slices 702 may have a dedicated function generator having an output 729 connected to second-level logic circuit 770.

Figure 7C:
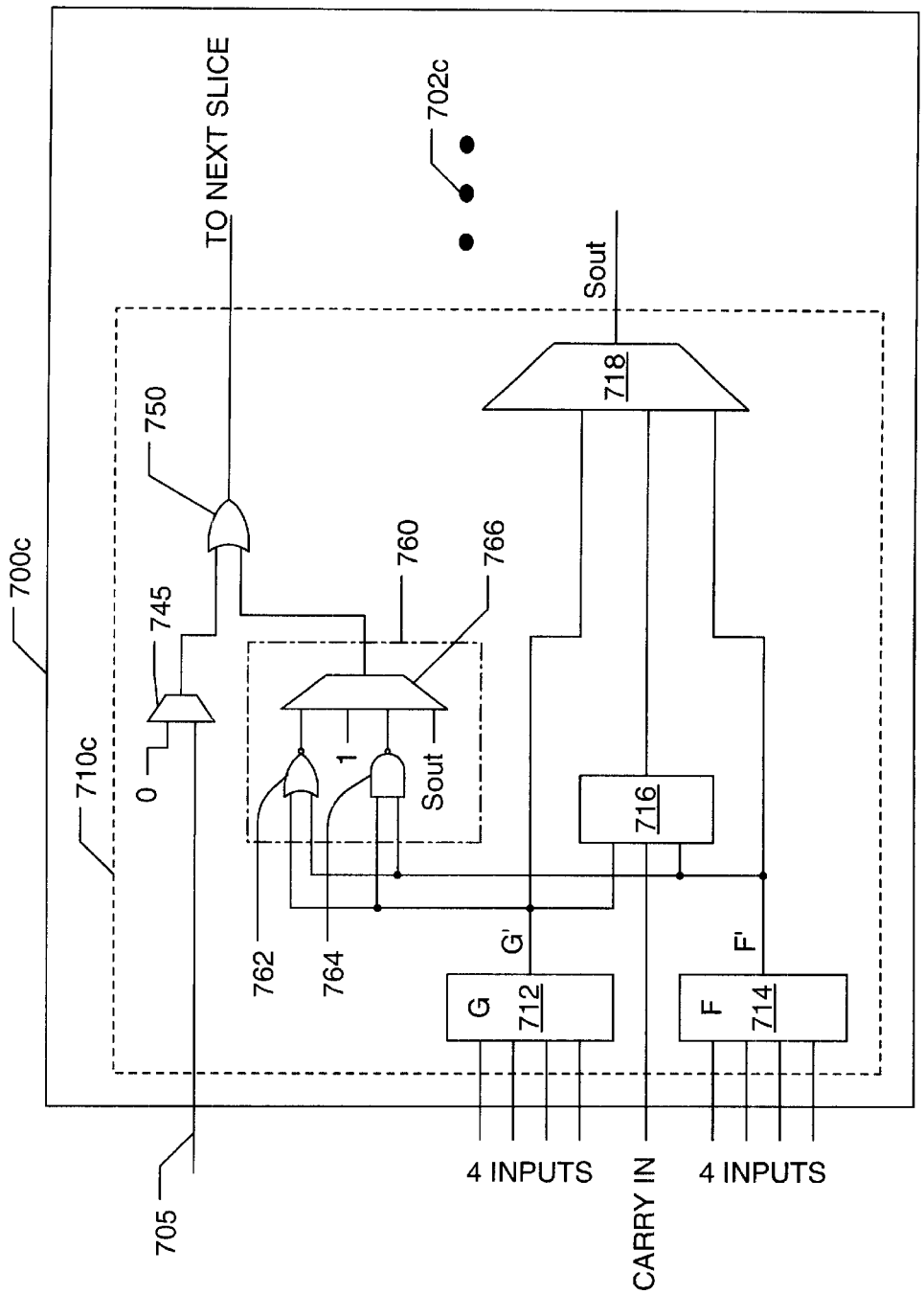
FIG. 7C illustrates a CLB having both a dedicated function generator and a combining gate within each CLB slice.

Section 6: Combining Dedicated Function Generator and Combining Gate Within a Slice FIG. 7C depicts a CLB 700*c* in accordance with another embodiment. Portions of this embodiment are similar to those shown in FIG. 7A. For convenience, components in FIG. 7C that are similar to components in FIG. 7A are assigned the same reference numerals, analogous but changed components are assigned the same reference numerals accompanied by letter "c," and different components are assigned different reference numerals.

Referring to FIG. 7C, a CLB 700*c* includes a slice 710*c* having both a dedicated function generator 760 and a combining gate 750 within slice 710*c*. Combining gate 750 may be an OR gate as shown, a NAND gate with inverted inputs(see gate 650*a* in FIG. 6), a NAND gate without inverted inputs, or another appropriate circuit. A combining gate input 705, switched via a multiplexer 745 may be combined with output of dedicated function generator 760 to sum or to multiply the output of dedicated function generator 760 with combining gate input 705. Dedicated function generator 760 operates as discussed in Section 4 above and in connection with FIG. 7A. The combining gate 750 within the slice 710*c* operates as discussed in Section 3 above and in connection with FIG. 6.

CONCLUSION

From the foregoing, it will be appreciated that higher performance implementations of combinational logic circuits may be realized by decomposing the combinational logic using the literal-sharing technique described above. The performance can be further increased by utilizing CLBs having second-level logic circuits. As described, second-level logic circuits may be fabricated within the CLB but external to the slices. Alternatively, combining gates may be fabricated within the slices. Even further performance gains can be achieved by providing a dedicated function generator to each slice. The dedicated function generator efficiently combines the outputs of first and second function generators. The literal-sharing technique, the second-level logic circuits, and the dedicated function generator can be used alone, or in any combination, to realize higher performance implementations of combinational logic circuits on an FPGA.

Although several specific embodiments of the invention are described and illustrated above, the invention is not to be limited to the specific forms or arrangements of parts so described and illustrated. For example, the literal-sharing technique may be used to improve performance of combinational logic circuits implemented in any technology, and is not limited to FPGAS. Further, the second-level logic gates may perform any logic function, and are not limited to the sum function. The invention is limited only by the claims that follow.

What is claimed is:

1. A configurable logic block (CLB) for a programmable logic device (PLD) comprising:
   a first slice having at least two configurable function generators and generating a first slice output;
   a second slice having at least two configurable function generators and generating a second slice output; and
   a second level non-programmable circuit dedicated to forming a sum-of-products function using the first slice output and the second slice output.

2. The CLB recited in claim 1 wherein the second level non-programmable circuit is an OR gate.

3. The CLB recited in claim 1 further comprising:
   a third slice having at least one configurable function generator and generating a third slice output;
   a fourth slice having at least one configurable function generator and generating a fourth slice output; and
   wherein the second level non-programmable circuit also combines the third slice output and the fourth slice output.

4. The CLB recited in claim 3 wherein the second level non-Programmable circuit is a four-input NAND gate with inverted inputs.

5. A configurable logic block (CLB) for a programmable logic device (PLD) comprising:
   a first CLB slice having:
      at least two configurable function generators each receiving a plurality of inputs and each generating a function generator output;
      a combining circuit receiving the function generator outputs and generating a combined output; and
      a non-programmable dedicated logic gate for combining the first output with a dedicated logic gate input to generate a dedicated logic gate output wherein the dedicated logic gate input is an input to the first CLB slice and wherein a dedicated logic gate output is an output of the first CLB slice.

6. The CLB recited in claim 5 wherein the non-programmable dedicated logic gate is an OR gate.

7. A configurable logic block (CLB) for a programmable logic device (PLD) each CLB having at least one slice, each slice comprising:
   a first lookup table generating a first output;
   a second lookup table generating a second output; and
   a dedicated function generator for receiving the first output and the second output to generate a dedicated output, the dedicated function generator having a first non-programmable logic gate providing a first logic gate output, a second non-programmable logic gate providing a second logic gate output, and a multiplexer allowing selection between the two logic gate outputs.

8. The CLB recited in claim 7 wherein the dedicated function generator comprises:
   a NAND gate receiving the first output and the second output to generate a sum; and
   a NOR gate receiving the first output and the second output to generate a product.

9. A configurable logic block (CLB) for a programmable logic device (PLD), the CLB comprising:
   a. first and second CLB slices each having;
      i. a first configurable function generator generating a first output;
      ii. a second configurable function generator generating a second output;
      iii. a dedicated function generator for combining the first output and the second output to generate a first dedicated output; and
   b. a second level non-programmable circuit having a single logic function for combining the dedicated outputs of the first and the second CLB slices.

10. The CLB recited in claim 9 wherein the second level non-programmable circuit is an OR gate.

11. The CLB recited in claim 9 further comprising a third CLB slice providing a third dedicated output, a fourth CLB slice providing a fourth dedicated output, and wherein the second level non-programmable circuit also combines the third output and the fourth output.

12. The CLB recited in claim 11 wherein the second level non-programmable circuit is a four-input NAND gate with inverted inputs.

13. The CLB recited in claim 9 wherein the dedicated function generator comprises:
   an AND gate receiving the first output and the second output to generate a product;
   an OR gate receiving the first output and the second output to generate a sum; and
   a multiplexer allowing selection between the product and the sum.

14. A configurable logic block (CLB) for a programmable logic device (PLD), the CLB comprising:
   a first CLB slice having:
      a first configurable function generator generating a first output;
      a second configurable function generator generating a second output;
      a second level function generator for receiving the first output and the second output to generate a second level output, the second level function generator having a first non-programmable logic gate and a second non-programmable logic gate; and
      a non-programmable dedicated logic gate for combining the second level output with a dedicated logic gate input to generate a dedicated logic gate output.

15. The CLB recited in claim 14 wherein the dedicated function generator comprises:
   an AND gate receiving the first output and the second output to generate a product;
   an OR gate receiving the first output and the second output to generate a sum; and
   a multiplexer allowing selection between the product and the sum.

16. The CLB recited in claim 14 wherein the non-programmable dedicated logic gate is an OR gate.

* * * * *